United States Patent
Cheng et al.

(10) Patent No.: US 9,891,522 B2
(45) Date of Patent: Feb. 13, 2018

(54) METHOD AND COMPOSITION OF A CHEMICALLY AMPLIFIED COPOLYMER RESIST

(71) Applicant: Taiwan Semiconductor Manufacturing Company, Ltd., Hsin-Chu (TW)

(72) Inventors: Ya-Ling Cheng, Yilan County (TW); Ching-Yu Chang, Hsin-Chu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/812,521

(22) Filed: Jul. 29, 2015

(65) Prior Publication Data
US 2016/0342087 A1    Nov. 24, 2016

Related U.S. Application Data

(60) Provisional application No. 62/163,103, filed on May 18, 2015.

(51) Int. Cl.
| | | |
|---|---|---|
| G03F 7/039 | (2006.01) | |
| G03F 7/32 | (2006.01) | |
| G03F 7/38 | (2006.01) | |
| G03F 7/16 | (2006.01) | |
| G03F 7/004 | (2006.01) | |
| G03F 7/00 | (2006.01) | |

(52) U.S. Cl.
CPC .......... G03F 7/0392 (2013.01); G03F 7/0002 (2013.01); G03F 7/0045 (2013.01); G03F 7/16 (2013.01); G03F 7/162 (2013.01); G03F 7/168 (2013.01); G03F 7/322 (2013.01); G03F 7/325 (2013.01); G03F 7/38 (2013.01)

(58) Field of Classification Search
None
See application file for complete search history.

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2013/0323641 A1 | 12/2013 | Chang | |
| 2013/0323647 A1* | 12/2013 | Ohashi | G03F 7/38 430/285.1 |
| 2014/0011133 A1 | 1/2014 | Liu et al. | |
| 2014/0017615 A1 | 1/2014 | Chang | |

(Continued)

FOREIGN PATENT DOCUMENTS

| | | |
|---|---|---|
| KR | 20140139525 | 12/2014 |
| TW | I308155 B | 4/2009 |

(Continued)

*Primary Examiner* — Sin Lee
(74) *Attorney, Agent, or Firm* — Haynes and Boone, LLP (57) ABSTRACT

The present disclosure provides a sensitive material. The sensitive material comprises a copolymer that includes polymer units including a hydrophobic unit; a hydrophilic unit comprising an acid generator; and a connection unit bonded between the hydrophobic unit and the hydrophilic unit, the connection unit comprising an acid-labile group.

16 Claims, 7 Drawing Sheets

(56) References Cited

U.S. PATENT DOCUMENTS

| | | |
|---|---|---|
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |

FOREIGN PATENT DOCUMENTS

| | | |
|---|---|---|
| TW | 201026653 A | 7/2010 |
| TW | 201402625 A | 1/2014 |
| WO | WO 2013147325 | 10/2013 |

\* cited by examiner

METHOD AND COMPOSITION OF A CHEMICALLY AMPLIFIED COPOLYMER RESIST

PRIORITY INFORMATION

This application claims priority to U.S. Provisional Patent Application Ser. No. 62/163,103, filed May 18, 2015, the entire disclosure of which is hereby incorporated herein by reference.

BACKGROUND

Semiconductor technologies are continually progressing to smaller feature sizes, down to 65 nanometers, 45 nanometers, and below. Resist materials used to produce such small feature sizes no longer meet the requirement of resolution and process. For example, an existing positive tone resist coated on a substrate surface is irradiated by UV light through a photomask, generating proton acid in the exposed areas. Then, a post exposure baking process is applied to the substrates for enhancing the acid amplification and the acid reaction with resist causes the polarity transformation in the exposed areas. A developer rinse is applied to the resist for dissolving the resist in the exposed areas. However, the resist and the corresponding method are vulnerable due to acid diffusion, especially during the post exposure baking. This leads to the presence of the acid in the unexposed areas, resulting in low imaging contrast and degraded imaging quality. For example, as a result of acid diffusion, it is difficult to transfer narrow trench patterns such as metal lines and narrow column patters such as via holes using current lithography techniques. Therefore, what is needed is a method and the material to improve the imaging contrast and quality of lithographic pattern transfer.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
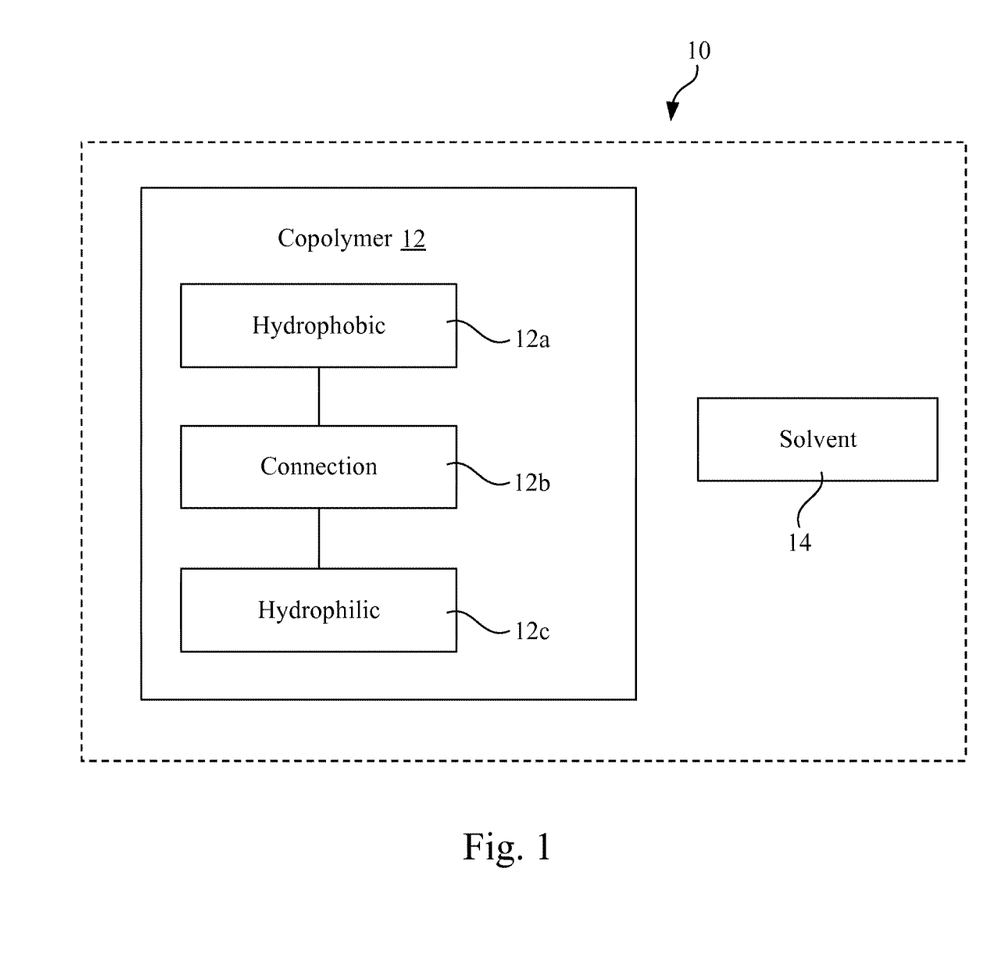
FIG. 1 is a block diagram illustrating a sensitive material according to aspects of the present disclosure in another embodiment.

FIG. 1 is a block diagram illustrating a sensitive material 10 according to aspects of the present disclosure in another embodiment.

The sensitive material 10 includes copolymer 12, which comprises one or more polymer units coupled by chemical bonds. The one or more polymer units include a hydrophobic unit 12a, a connection unit 12b, and a hydrophilic unit 12c, coupled as indicated in FIG. 1. In one embodiment, the hydrophobic unit 12a may comprise a stabilization group that provides resistance to acid diffusion. In furtherance of this embodiment, the connection unit 12b may comprise an acid-labile group that undergoes a polarity transformation when it reacts with acid. For example, the acid-labile group may convert from non-polar to polar when reacted with acid. Additionally, in this embodiment, hydrophilic unit 12c may comprise an acid generator group that produces an acid when exposed to visible light, ultraviolet radiation and/or other types of energy, including but not limited to photon, thermal, electronic, and/or mechanical energy.

The composition of copolymer 12, in terms of the volume fractions (vol %) of hydrophobic unit 12a, connection unit 12b, and hydrophilic unit 12c, may be adjusted for particular applications. More specifically, the volume fractions may be adjusted in order to achieve a particular morphology upon microphase separation by self-assembly. In one embodiment, the volume fractions of both hydrophobic unit 12a and hydrophilic unit 12c range between 30 vol % and 60 vol %, and the volume fraction of connection unit 12b ranges between 0 vol % and 20 vol %. In this embodiment, copolymer 12 may form a laminar morphology upon microphase separation by self-assembly. In another embodiment, the volume fraction of hydrophobic unit 12a ranges between 60 vol % and 90 vol %, the volume fraction of connection unit 12b ranges between 0 vol % and 20 vol % and the volume fraction of hydrophilic unit 12c ranges between 10 vol % and 40 vol %. In this embodiment, copolymer 12 may form a cylindrical morphology upon microphase separation by self-assembly. In yet another embodiment, the volume fractions of hydrophobic unit 12a, connection unit 12b, and hydrophilic unit 12c each range between 20 vol % and 40 vol %. In this embodiment, limited or no microphase separation of copolymer 12 may occur, resulting in a random phase. Alternately, another composition of copolymer 12 may be selected in order to achieve various other morphologies or other properties.

The sensitive material 10 may further include a solvent 14. The presence and relative amount of solvent 14 in sensitive material 10 may vary. In one embodiment, the solvent 14 may be fully or partially removed by evaporation and baking steps, such as soft baking and hard baking. In some embodiments, solvent 14 may include one or more additive materials, such a surfactant to enhance the development process.

In some embodiments, sensitive material 10 may be a chemically amplified (CA) resist. In furtherance of these embodiments, sensitive material 10 may include a quencher for quenching acid reactions. In an alternative embodiment, a quencher is unnecessary because acid generation and diffusion is confined to particular microphases of copolymer 12.

Figure 2:
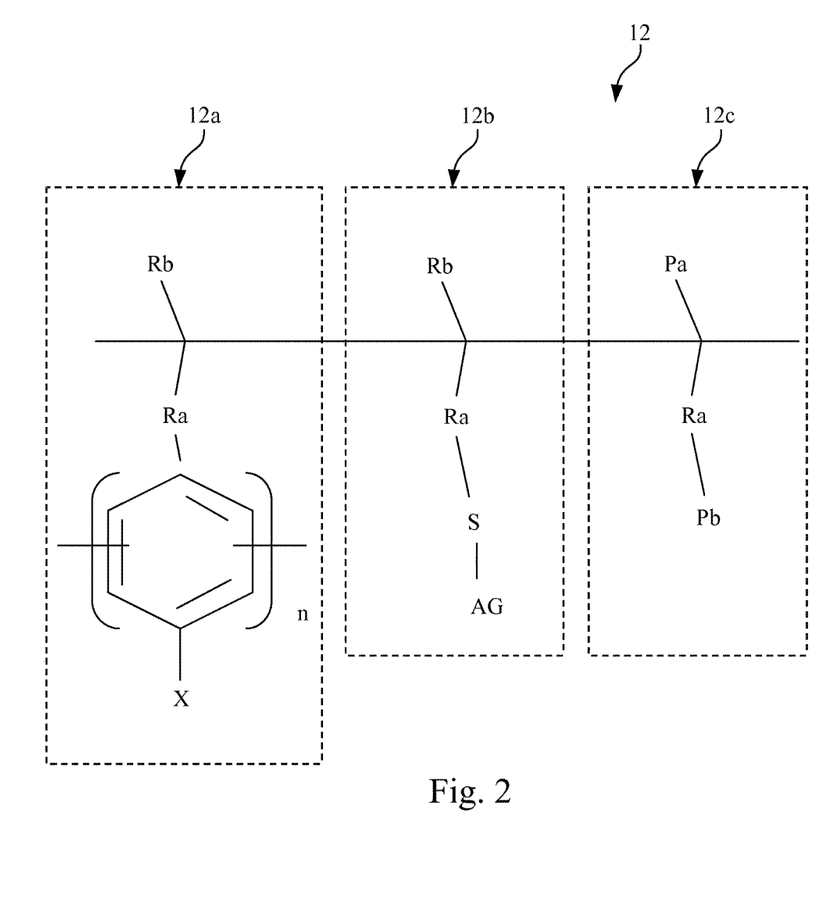
FIG. 2 shows a formula of a copolymer according to one embodiment

FIG. 2 shows a formula of copolymer 12 according to one embodiment. As in FIG. 1, copolymer 12 includes a hydrophobic unit 12a, a connection unit 12b, and a hydrophilic unit 12c. In one embodiment of the formula, Rb comprises a chemical group selected from one of the following: H and $CH_3$. Ra comprises a chemical group selected from the following: saturated, unsaturated, straight, branched, or cyclic alkyl, alkoxyl, fluoroalkyl, fluoroalkoxyl, carbonyl, hydroxyl, carboxyl, ester, ether, amide, and amine with a carbon chain having a length ranging between 0 and 12 carbon units. X comprises a chemical group selected from the following: H, halide, saturated, unsaturated, straight, branched, or cyclic alkyl, alkoxyl, fluoroalkyl, fluoroalkoxyl, carbonyl, hydroxyl, carboxyl, ester, ether, amide, amine, imine, imide, nitrate, nitrile, and end group with the carbon chain having a length ranging between 1 and 12 carbon units. S comprises a chemical group selected from the following: saturated, unsaturated, straight, branched, or cyclic alkyl, alkoxyl, fluoroalkyl, fluoroalkoxyl, carbonyl, and hydroxyl with a carbon chain having a length ranging between 0 and 12 carbon units. AG comprises a chemical group selected from the following: aromatic ring, 2D or 3D carbon ring, H, halide, saturated, unsaturated, straight, branched or cyclic alkyl, alkoxyl, fluoroalky, fluoroalkoxyl, carbonyl, hydroxyl, carboxylic, ester, ether, hydroxyl, amide, amine, imine, imide, nitrate, nitrile, and end group with the carbon chain having a length ranging between 1 and 16 carbon units. Pa comprises a polar group selected from the following: H, halide, saturated, unsaturated, straight, branched cyclic alkyl alkoxyl, fluoroalky, fluoroalkoxyl, carbonyl, hydroxyl, carboxylic, ester, ether, hydroxyl, amide, amine, imine, imide, nitrate, nitrile, and end group with the carbon chain having a length ranging between 1 and 16 carbon units. Pb comprises a photoacid generator (PAG) group selected from the following: diazonium salts, phosphonium salts, sulfonium salts, iodonium salts, imide sulfonates, oxime sulfonates, diazodisulfone, disulfone, and o-nitrobenzyl sulfonate. The PAG generates acid when exposed to visible light, ultraviolet radiation, and/or other types of energy, including but not limited to photon, thermal, electronic, and/or mechanical energy.

In another embodiment, Pa may further comprise a chemical group selected from one of the following: —COOH, —OH, —NH2, aldehyde, and carbonyl.

Figure 3:
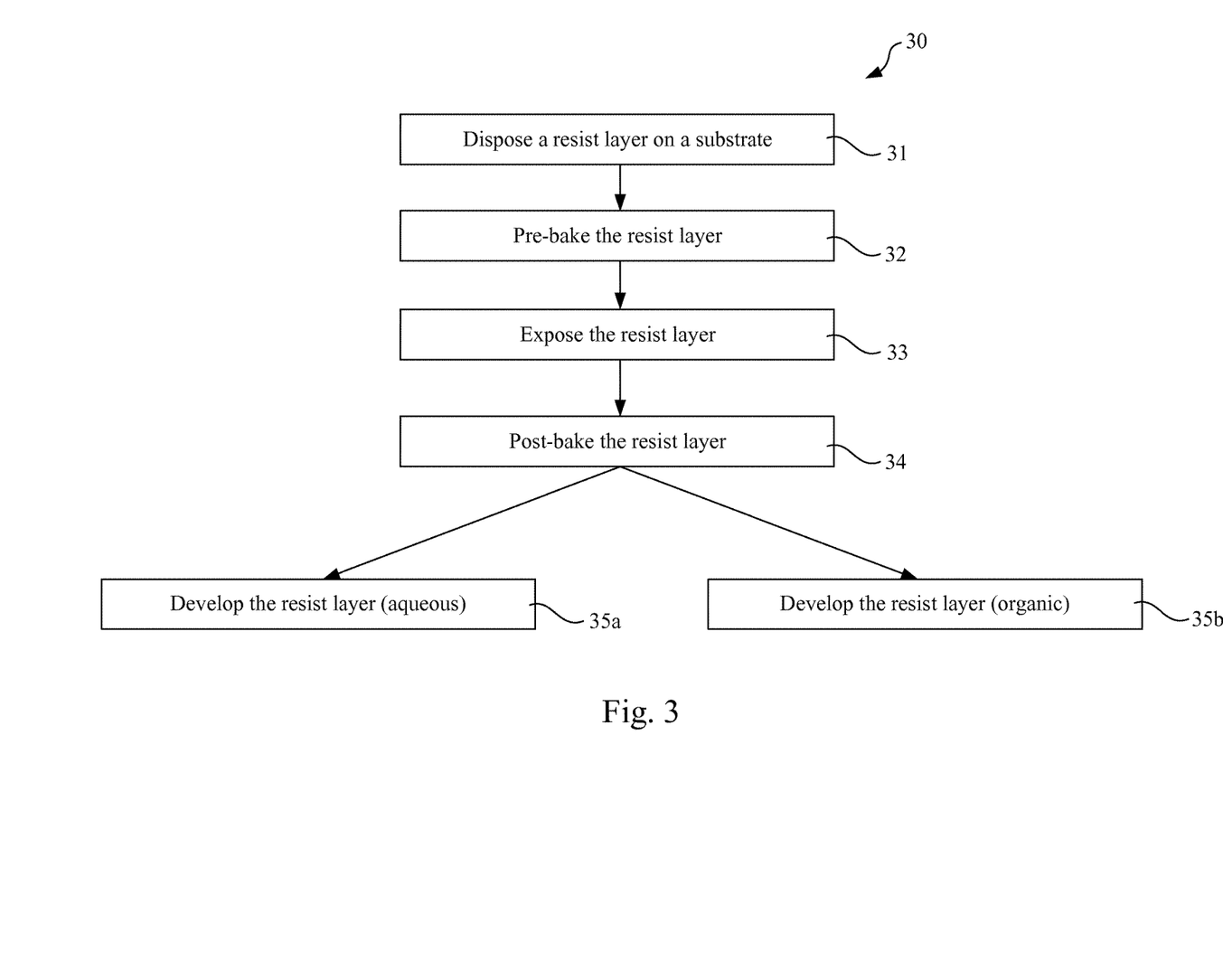
FIG. 3 is a flowchart showing one embodiment of a method of lithography patterning process.
Figure 4:
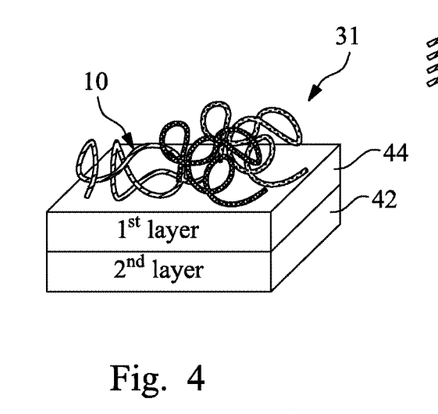
FIGS. 4, 5, 6, 7, 8a, 8b, 9, 10, 11, 12, 13a, 13b, 14, 15, 16, 17, 18a, 18b, 19, 20, 21, 22, 23a, and 23b are simplified diagrams of a structure during various fabrication stages of the lithography process of FIG. 3 according to various embodiments.

FIG. 3 is a flowchart showing one embodiment of a method 30 of a lithography patterning process. FIGS. 4 through 23b are simplified diagrams of a structure during various fabrication stages of the lithography process according to various embodiments.

Referring to FIGS. 3, 4, 9, 14, and 19, the method 30 begins at coating process 31, which comprises coating onto neutral layer 42 a copolymer resist layer 44 comprising sensitive material 10. Neutral layer 42 may be coated on a substrate such as a semiconductor wafer or other suitable structure with a pattern such as an integrated circuit formed or to be formed thereon. The substrate may include a silicon substrate having various doped regions, dielectric features, and/or multilevel interconnects. The substrate may alternatively include other suitable semiconductor material, including Ge, SiGe, or GaAs. The substrate may alternatively include a non-semiconductor material such as a glass plate for thin-film-transistor liquid crystal display (TFT-LCD) devices, a fuse quartz substrate for a photomask, or a magnetic material for data storage. The substrate may further include one or more material layers to be patterned.

Neutral layer 42 comprises an organic material, inorganic material, treatments, or a suitable combination thereof. In the present embodiment, the neutral layer 42 comprises a neutral copolymer with the same polymer units as copolymer 12 (i.e., hydrophobic unit 12a, connection unit 12b, and hydrophilic unit 12c) configured with the volume fractions of each polymer unit ranging between 20 vol % and 40 vol %. The neutral layer 42 may alternately comprise copolymer 12 configured with another suitable set of volume fractions. The neutral layer 42 may further include a metal alloy, including but not limited to an alloy comprising one or more of Au, Ag, Cu, Pt, Fe, Cr, Al, Ti, W, and Zn. The neutral layer may further comprise a spin-on coating such as a bottom anti-reflection coating (BARC and/or Si-BARC). The neutral layer 42 may further be treated according to one or more treatments, including but not limited to UV curing, solvent fluid rinse, water fluid rinse, gas vapor treatment, and plasma treatment.

The copolymer resist layer 44 is formed by disposing onto neutral layer 42 the sensitive material 10 by any suitable technique, such as a spin-coating technique. The thickness of copolymer resist layer 44 is configurable, and may be determined by adjusting the coating process and/or the composition of sensitive material 10. In some embodiments, the thickness of copolymer resist layer may range between 10 nm and 200 nm. In another embodiment, the copolymer resist layer may form a monolayer, such as a self-assembled monolayer (SAM). In the present embodiment, limited or no microphase separation of copolymer resist layer 44 occurs during coating process 31. That is, copolymer 10 is arranged substantially randomly over the substrate surface. In an alternate embodiment, copolymer resist layer 44 may be disposed such that full or partial microphase separation of copolymer 12 occurs during coating process 31. For example, microphase separation may be achieved by selecting a suitable coating technique, such as an appropriately controlled dip coating technique.

Referring to FIGS. 3, 5, 10, 15 and 20, the method 30 proceeds to pre-baking process 32, which comprises pre-baking the copolymer resist layer 44 using a suitable baking mechanism, such as a hotplate or an oven. During process 32, the substrate with neutral layer 42 and copolymer resist layer 44 is heated to an elevated baking temperature. In some embodiments, the baking temperature ranges between 100 C and 250 C and the baking time ranges between one minute and three minutes. Alternately, other suitable baking temperatures and times may be used. In some embodiments, pre-baking process 32 is a soft baking process, wherein a portion of solvent 14 in copolymer resist layer 44 evaporates.

During pre-baking process 32, the copolymer 12 in copolymer resist layer 44 self-assembles to form a two-dimensional morphology on the surface of neutral layer 42. Self-assembly, driven by thermal energy from baking, causes hydrophobic unit 12a and hydrophilic unit 12c of copolymer 12 to separate into non-polar and polar microphases, respectively. As discussed above in reference to FIG. 1, the particular morphology obtained during self-assembly is configurable, for example, by selecting suitable volume fractions of hydrophobic unit 12a, connection unit 12b, and hydrophilic unit 12c in copolymer 12. Other parameters may further contribute to the morphology obtained during self-assembly, including but not limited to the lengths and/or chemical formulas of units 12a-c of copolymer 12; the composition of solvent 14 and/or sensitive material 10; the material of neutral layer 42; the presence of patterned structures on the underlying substrate; and the process parameters of coating process 31 and pre-baking process 32.

Figure 5:
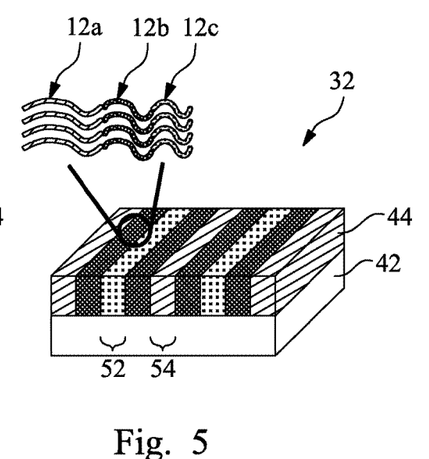

In the embodiment shown in FIG. 5, the morphology obtained during pre-baking process 32 is a lamellar morphology, wherein hydrophobic (non-polar) units 12a and hydrophilic (polar) units 12c of copolymer 12 separate into parallel stripes of opposite polarity (i.e., polar stripes 52 and non-polar stripes 54). The connection units 12b of copolymer 12 are bonded between the polar stripes 52 and non-polar stripes 54 in the lamellar morphology. The width of stripes 62 and 64 is associated with the lengths of polymer units 12a-c of copolymer 12. In the present embodiment, the width of stripes 52 and 54 ranges between 10 nm and 20 nm. Over a wide area of the substrate, the stripes of the copolymer resist layer 44 may form various arrangements after pre-baking step 32. In one embodiment, copolymer resist layer 44 may form a web-like arrangement of randomly oriented stripes. In another embodiment, copolymer resist layer 44 may form a regular pattern of parallel stripes. In yet another embodiment, the copolymer resist layer 44 may form stripes that are aligned with underlying features of the substrate, such as integrated circuit features.

Figures 9, 10:
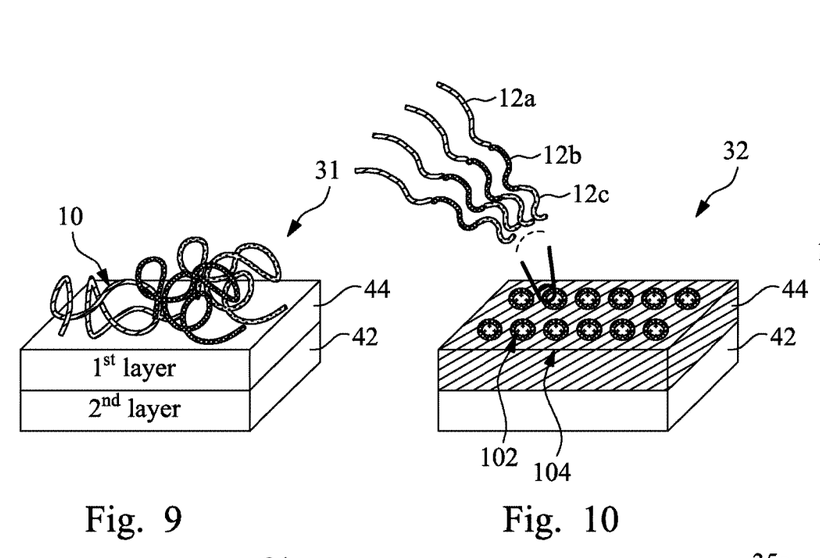

In an alternative embodiment shown in FIG. 10, the morphology obtained during pre-baking process 32 is a cylindrical morphology, wherein hydrophilic (polar) units 12c and hydrophobic (non-polar) units 12a of copolymer 12 separate into polar cylinders 102 embedded in a non-polar matrix 104. The connection units 12b of copolymer 12 are bonded between polar cylinders 102 and non-polar matrix 104 in the cylindrical morphology. The radius and spacing of cylinders 102 is associated with the length of polymer units 12a-c of copolymer 12. In the present embodiment, the radius of cylinders 102 ranges between 10 nm and 20 nm. Over a wide area of the substrate, the cylinders of the copolymer resist layer 44 may form various arrangements after pre-baking step 32. In one embodiment, copolymer resist layer 44 may form an arrangement of randomly located cylinders. In another embodiment, copolymer resist layer 44 may form a regular pattern of cylinders, such as a grid or a hexagonally packed pattern. In yet another embodiment, the locations of cylinders may be aligned with underlying features of the substrate, such as integrated circuit features.

Referring to FIGS. 3, 6, 11, 16 and 21, the method 30 proceeds to exposure process 33, during which copolymer resist layer 44 is exposed using a lithography exposure tool, such as a scanner operable in a step and scan operation for exposure. During exposure process 33, the substrate with neutral layer 42 and copolymer resist layer 44 is transferred to a lithography exposure tool for an exposing process. In embodiments of the exposing process, the copolymer resist layer 44 is exposed to radiation energy such as deep ultra-violet (DUV) or extreme ultra-violet (EUV), and/or a charged particle beam such as an electron beam or ion beam. In various examples for illustration, the radiation energy may include a 248 nm beam by Krypton Fluoride (KrF) excimer lasers or a 193 nm beam by Argon Fluoride (ArF) excimer lasers. In other illustrative examples, the radiation energy may include EUV with a wavelength of about 13.5 nm, X-ray radiation with a wavelength less than about 1 nm, and/or an electron beam with an energy of less than about 100 eV.

Figure 6:
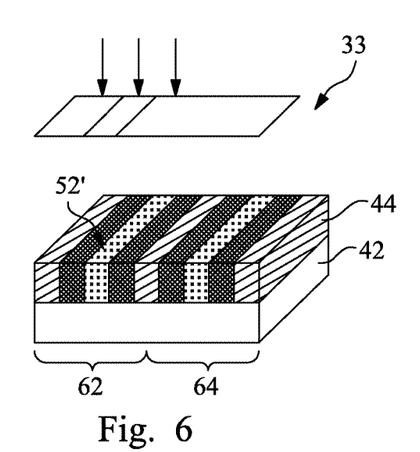
Figure 7:
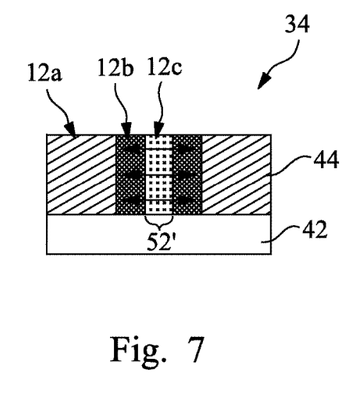
Figure 11:
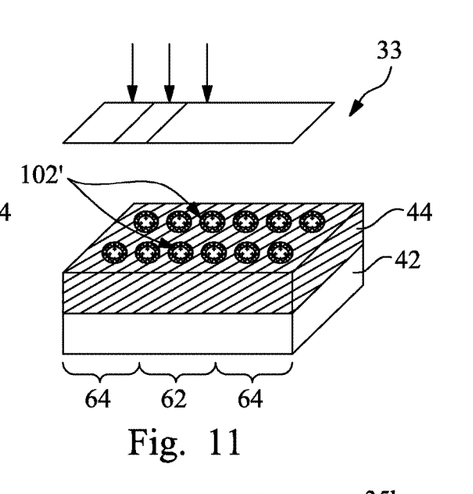
Figures 12, 13A:
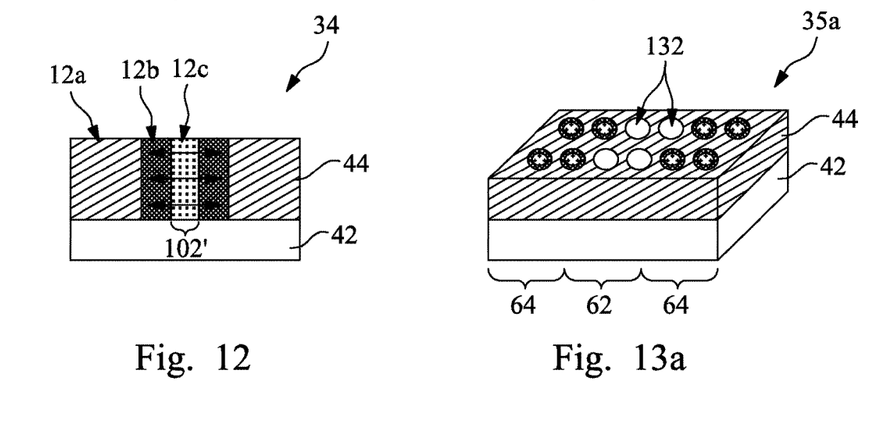

In embodiments shown in FIGS. 6 and 11, copolymer resist layer 44 is exposed to radiation through a photomask (mask or reticle) having a pattern, such as an integrated circuit pattern predefined according to a design layout. The photomask results in a projected pattern on copolymer resist layer 44 that includes one or more exposed regions such as exposed feature 62 and one or more unexposed regions such as unexposed feature 64. In some embodiments, the features of the projected pattern may have similar dimensions to the features of the self-assembled copolymer morphology. In these embodiments, the resist pattern that results from combining the projected pattern with the self-assembled copolymer morphology may include iso or semi-iso pitch features. In an alternative embodiment, the features of the projected pattern may have larger dimensions than the features of the self-assembled copolymer morphology. In these examples, the resist pattern may include dense pitch features, the dense features being primarily defined by the self-assembled copolymer morphology rather than a projected pattern.

Figure 16:
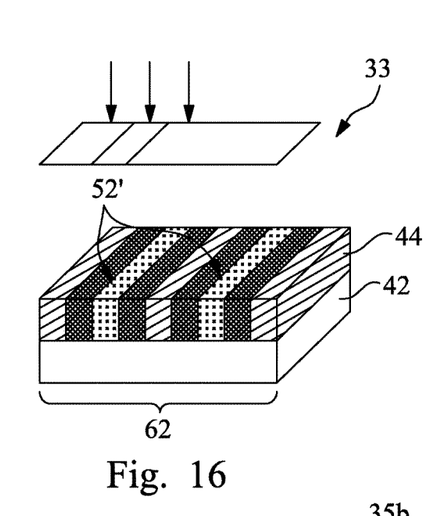
Figure 17:
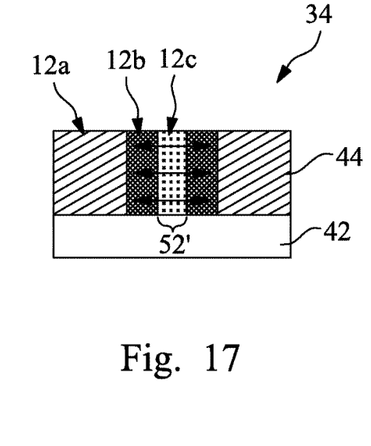
Figure 21:
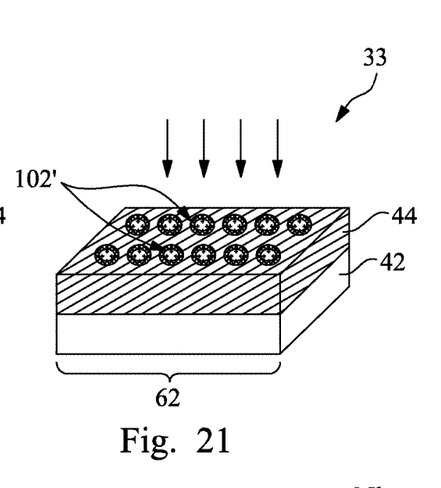
Figure 22:
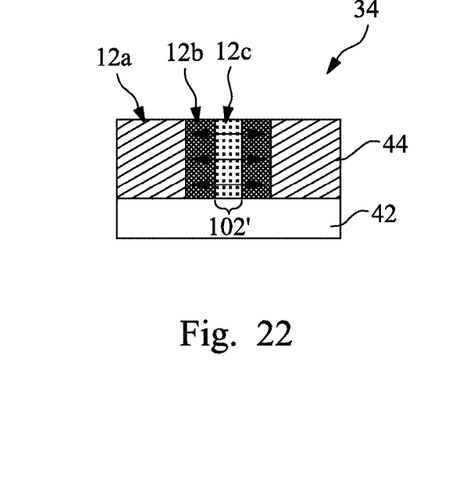
Figures 23A, 23B:
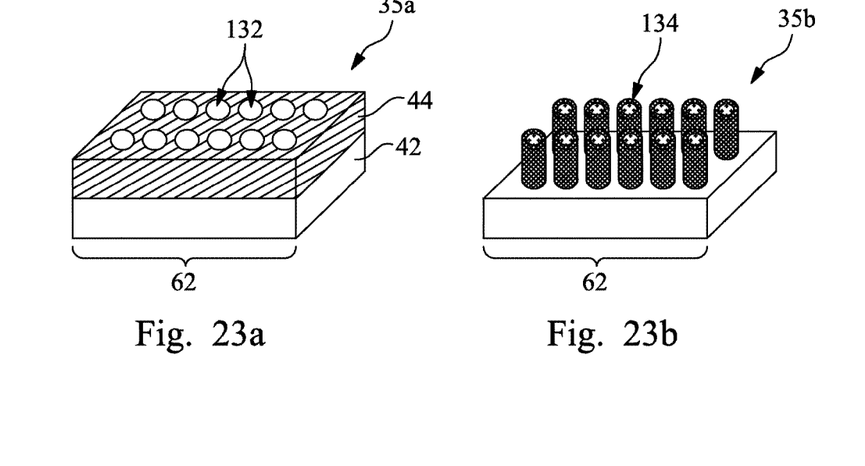

In embodiments shown in FIGS. 16 and 21, no photomask is used during the exposure process. In these embodiments, exposed region 62 encompasses all or most of the substrate. In the absence of a projected pattern, the resist pattern is entirely, or almost entirely, defined by the self-assembled copolymer morphology. The resulting resist pattern has dense pitch features.

During exposure process 33, acid is generated in the copolymer resist layer 44 within exposed features 62 by the PAG of the copolymer resist layer 44. More specifically, in the embodiment shown in FIG. 6, acid generation may be partly or entirely localized to polar stripes 52' within exposed features 62. Similarly, in the embodiment shown in FIG. 11, acid generation may be partly or entirely localized to polar cylinders 102' within exposed features 62. Localization occurs because the PAG of the copolymer resist layer 44 is included in the hydrophilic (polar) units 12c of the copolymer 12 and absent from the hydrophobic (non-polar) units 12a. Accordingly, during exposure process 33, acid is generated in exposed polar features (i.e., stripes 52' and/or cylinders 102'), while no substantial acid generation occurs elsewhere in copolymer resist layer 44.

Referring to FIGS. 3, 7, 12, 17, and 22, the method 30 proceeds to post-baking process 34, which may comprise a post-exposure bake (PEB) process. During post-baking process 34, the substrate with neutral layer 42 and copolymer resist layer 44 is heated to an elevated baking temperature using a suitable baking mechanism, such as a hotplate or an oven. In one embodiment, the baking temperature may be higher than the baking temperature used in pre-baking process 32, for example, the temperature may range between 5 C and 30 C hotter. Alternately, other suitable baking temperatures may be used. In some embodiments, post-baking process 34 is a hard baking process, wherein most or all of the remaining solvent 14 in copolymer resist layer 44 evaporates.

In the present embodiment, during post-baking process 34, the acid generated in polar features (i.e. stripes 52' and/or cylinders 102') during exposure process 33 diffuses from hydrophilic units 12c into adjacent connection units 12b of copolymers 12 and undergoes catalytic acid reactions with the acid-labile groups of connection units 12b. In one embodiment, the catalytic acid reactions may transform connection units 12b from non-polar to polar. In this embodiment, the acid diffusion and/or reaction mechanisms may be suppressed in hydrophobic units 12c, thereby localizing the catalytic reactions to polar features (i.e. stripes 52' and/or cylinders 102') and any adjacent connection units 12b. The diffusion and reaction mechanisms of baking process 44 are driven by thermal energy provided by the baking mechanism. Upon completion of post-baking process 34, exposed polar features (i.e. stripes 52' and/or cylinders 102') and adjacent connection units have a polar microphase. The localization of the catalytic reactions by the morphology of the self-assembled copolymers may provide for very sharp transitions between polar and non-polar regions.

Referring to FIGS. 3, 8a, 13a, 18a, and 23a, the method 30 proceeds to aqueous development process 35a. During aqueous development process 35a, the substrate with neutral layer 42 and copolymer resist layer 44 is fully or partially immersed in an aqueous (polar) developing solution. The aqueous developing solution dissolves polar features of copolymer resist layer 44 and does not dissolve non-polar features. After post-baking step 34, polar features of copolymer resist layer 44 include connection units 12b and hydrophilic units 12c of copolymer 12 within exposed features 62. Thus, aqueous development process 35a results in the formation of narrow trenches 82 (FIG. 8a) and/or narrow holes 132 (FIG. 13a) within exposed features 62 of copolymer resist layer 44 while all other resist portions remain. In embodiments shown in FIGS. 8a and 13a, in which a photomask was used during exposure process 33, a positive image representing a superposition of a photomask pattern and a self-assembled copolymer morphology is transferred. In embodiments shown in FIGS. 18a and 23a, in which no photomask was used during exposure process 33, an image comprising substantially all of the polar regions of the self-assembled copolymer morphology is transferred.

Figure 8A:
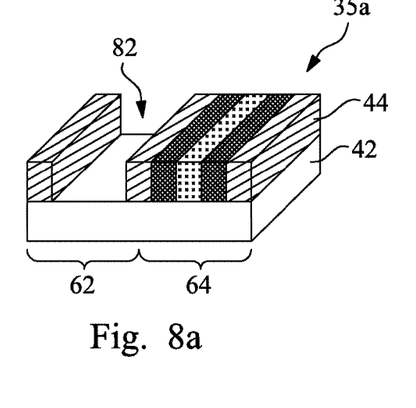
Figure 8B:
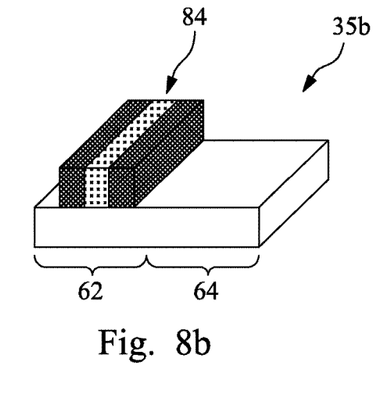
Figure 13B:
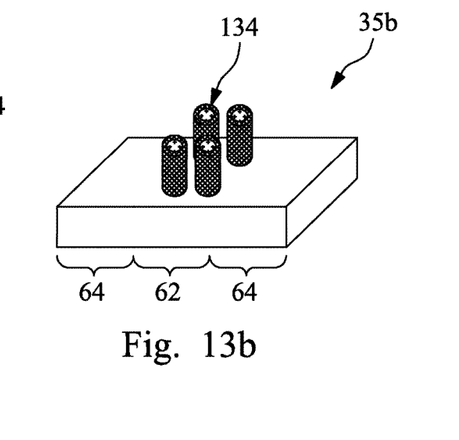
Figure 14:
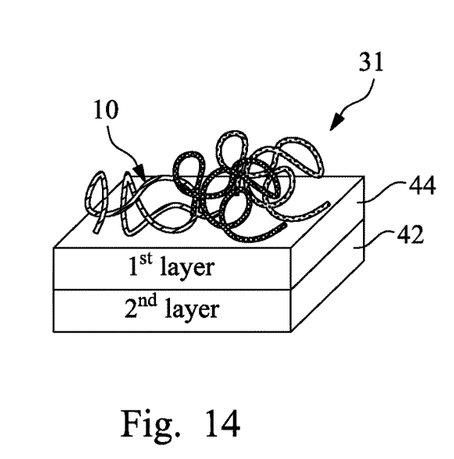
Figure 15:
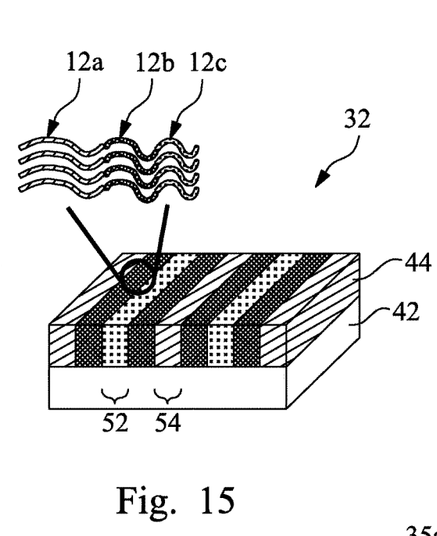
Figure 18A:
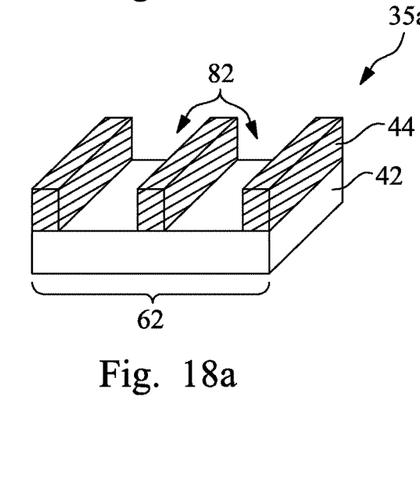
Figure 18B:
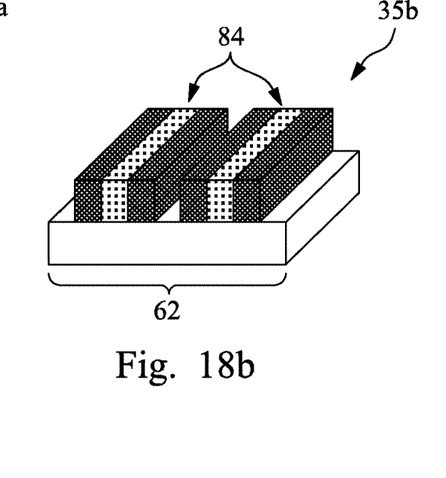
Figure 19:
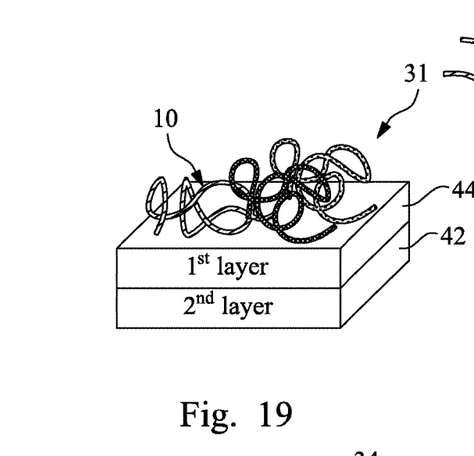
Figure 20:
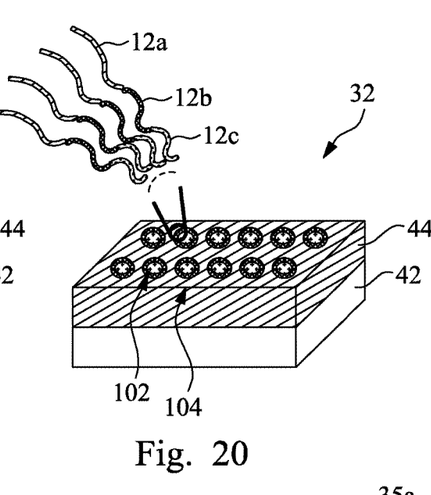

Referring to FIGS. 3, 8b, and 13b, the method 30 may alternately proceed to organic development process 35b. During organic development process 35b, the substrate with neutral layer 42 and copolymer resist layer 44 is fully or partially immersed in an organic (non-polar) developing solution. In contrast to aqueous development 35a, the organic developing solution used in organic development process 35b dissolves non-polar regions of copolymer resist layer 44 and does not dissolve polar portions. After baking step 34, the only polar regions of copolymer resist layer 44 include connection units 12b and hydrophilic units 12c of copolymer 12 within the exposed regions. Thus, development step 35 results in the formation of narrow lines 84 (FIG. 8b) and/or narrow cylinders 134 (FIG. 13b) within exposed features 62 of copolymer resist layer 44, while all other resist portions are dissolved. That is, a negative image representing a superposition of a photomask pattern and a self-assembled copolymer morphology is transferred. In embodiments shown in FIGS. 8b and 13b, in which a photomask was used during exposure process 33, a negative image representing a superposition of a photomask pattern and a self-assembled copolymer morphology is transferred. In embodiments shown in FIGS. 18b and 23b, in which no photomask was used during exposure process 33, an image comprising substantially all of the non-polar polar regions of the self-assembled copolymer morphology is transferred.

Various changes, substitutions and alterations can be made herein without departing from the spirit and scope of the present disclosure. For example, the exposure process 33 may utilize an immersion photolithographic technique. In furtherance of the embodiment, the lithography exposure tool may further include an immersion fluid between the semiconductor structure 100 and a lens of a lithography exposure tool.

Thus, the disclosed method and the copolymer resist material provides a lithography patterning technique of either positive (FIGS. 8a and 13a) or negative (FIGS. 8b and 13b) tone imaging, wherein the transferred image is a superposition of a photomask pattern and a self-assembled lamellar and/or cylindrical pattern of the copolymer resist.

The present disclosure provides an embodiment of a copolymer. The copolymer comprises polymer units including a hydrophobic unit; a hydrophilic unit comprising an acid generator group; and a connector unit bonded between the hydrophobic unit and the hydrophilic unit, the connector unit comprising an acid-labile group. The composition of the polymer, in terms of the volume fractions of the constituent polymer units, may be selected to achieve various morphologies during self-assembly, such as lamellar or cylindrical morphologies.

The present disclosure further provides an embodiment of a sensitive material, such as a chemically amplified (CA) resist. The sensitive material comprises the copolymer described above and additionally comprises a solvent. The composition of the copolymer used in the sensitive material is selected to self-assemble into a desired morphology of non-polar and polar microphases when disposed on a substrate. The morphology may be, for example, a lamellar or a cylindrical morphology. The sensitive material is responsive to exposure to radiation energy and is suitable for use in a lithography processes.

The present disclosure further provides an embodiment of a lithography method based on the sensitive material described above. The lithography method comprises forming a resist layer on a substrate, the resist layer comprising the sensitive material separated into a self-assembled morphology of non-polar and polar microphases; exposing the resist layer to generate acid in the polar microphases; baking the resist layer to diffuse the acid into adjacent regions comprising acid-labile groups; and developing the resist layer in an aqueous or organic solvent.

The foregoing has outlined features of several embodiments so that those skilled in the art may better understand the foregoing detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method, comprising:
   depositing a first copolymer layer on a substrate;
   depositing a second copolymer layer on the first copolymer layer, wherein the first and the second copolymer layers each comprises:
   a hydrophobic unit;
   a hydrophilic unit comprising an acid generator group; and
   a connection unit bonded between the hydrophobic unit and the hydrophilic unit, the connection unit comprising an acid-labile group;
   wherein the hydrophobic unit, the hydrophilic unit, and the connection unit of the first copolymer layer are each present in an amount that ranges between 20% and 40% by volume;
   wherein the hydrophobic unit of the second copolymer layer are present in an amount that ranges between 60% and 90% by volume, the hydrophilic unit of the second copolymer layer are present in an amount that ranges between 10% and 40% by volume, and the connection unit of the second copolymer layer are present in an amount under 20% by volume;

pre-baking the first and second copolymer layers so that the second copolymer layer separates into a morphology of non-polar and polar microphase regions by self-assembly and the first copolymer layer remains substantially unseparated;

exposing the second copolymer layer to generate acid in the polar microphase regions within exposed features;

post-baking the first and second copolymer layers to diffuse the acid in the second copolymer layer into regions comprising acid-labile groups adjacent to the exposed polar microphase regions, the acid diffusion being suppressed in the non-polar microphase regions; and developing the second copolymer layer.

2. The lithography method of claim 1, wherein the first copolymer layer further comprises a metal alloy.

3. The lithography method of claim 1, wherein the morphology is a cylindrical morphology.

4. The lithography method of claim 1, wherein developing the second copolymer layer comprises transferring an image to the second copolymer layer, the image being a superposition of the exposed features and the morphology of the self-assembled copolymers.

5. The lithography method of claim 4, wherein developing the second copolymer layer further comprises developing the second copolymer layer in an aqueous solvent, wherein the transferred image is a positive tone image.

6. The lithography method of claim 4, wherein developing the second copolymer layer further comprises developing the second copolymer layer in an organic solvent, wherein the transferred image is a negative tone image.

7. A lithography method, comprising:

forming a first copolymer layer on a substrate;

depositing a second copolymer layer on the first copolymer layer, wherein the first and second copolymer layers formed of the same copolymer that comprises:
a hydrophobic unit comprising a stabilization group, the stabilization group providing resistance to acid diffusion;
a hydrophilic unit comprising an acid generator group; and
a connection unit bonded between the hydrophobic unit and the hydrophilic unit, the connection unit comprising an acid-labile group;

wherein the volume percentage of the hydrophobic unit in the first copolymer layer is present in an amount that ranges between 20% and 40% by volume and the hydrophobic units of the second copolymer layer are present in an amount that ranges between 30% and 60% by volume or an amount that ranges between 60% and 90% by volume;

providing thermal energy to the second copolymer layer to separate the copolymers of the second copolymer layer into the morphology of non-polar and polar microphase regions by self-assembly and the first copolymer layer remains substantially unseparated;

exposing at least a portion of the second copolymer layer to generate acid in exposed polar microphase regions of the second copolymer layer;

baking the second copolymer layer to diffuse acid into regions comprising acid-labile groups adjacent to the exposed polar microphase regions, the acid diffusion being suppressed in the non-polar microphase regions; and developing the second copolymer layer.

8. The lithography method of claim 7, wherein depositing the second copolymer layer includes performing a spin-coating technique.

9. The lithography method of claim 7, wherein the substrate is selected from a group consisting of: a semiconductor wafer having at least one of a doped region, a layer to be patterned, and a device; a glass plate having at least one of a doped region, a layer to be patterned, and a device; and a fuse quartz substrate having at least one of a doped region, a layer to be patterned, and a device.

10. The lithography method of claim 7, wherein developing the second copolymer layer comprises transferring an image to the second copolymer layer, the image being a superposition of the exposed features and the morphology of the self-assembled copolymers.

11. The lithography method of claim 10, wherein developing the second copolymer layer further comprises developing the second copolymer layer in an aqueous solvent, wherein the transferred image is a positive tone image.

12. The lithography method of claim 10, wherein developing the second copolymer layer further comprises developing the second copolymer layer in an organic solvent, wherein the transferred image is a negative tone image.

13. A lithography method, comprising:

depositing a first copolymer layer on a substrate;

depositing a second copolymer layer on the first copolymer layer, wherein the first and second copolymer layers each comprises:
a hydrophobic unit;
a hydrophilic unit comprising an acid generator group that generates acid in response to an exposure process; and
a connection unit bonded between the hydrophobic unit and the hydrophilic unit, the connection unit comprising an acid-labile group;

wherein the hydrophobic unit, the hydrophilic unit, and the connection unit of the first copolymer layer are each present in an amount that ranges between 20% and 40% by volume;

wherein the hydrophobic unit and the hydrophilic unit of the second copolymer layer are each present in an amount that ranges between 30% and 60% by volume, and the connection unit in the second copolymer layer are present in an amount under 20% by volume;

pre-baking the first and second copolymer layers so that the second copolymer layer separates into a morphology of non-polar and polar microphase regions by self-assembly and the first copolymer layer remains substantially unseparated;

exposing the second copolymer layer to generate acid within exposed features of the polar microphase regions of the second copolymer layer;

post-baking the first and second copolymer layers to diffuse the acid into regions of the second copolymer layer comprising acid-labile groups adjacent to the exposed features of the polar microphase regions, the acid diffusion being suppressed in the non-polar microphase regions; and developing the second copolymer layer.

14. The method of claim 13, wherein the first copolymer layer further comprises a metal alloy.

15. The method of claim 13, wherein forming the second copolymer layer includes performing a spin-coating technique.

16. The lithography method of claim 13, wherein the morphology is a lamellar-morphology.

\* \* \* \* \*